US009989238B2

(12) United States Patent
Chen et al.

(10) Patent No.: US 9,989,238 B2
(45) Date of Patent: Jun. 5, 2018

(54) LOW LIGHT FAILURE, HIGH POWER LED STREET LAMP AND METHOD FOR MANUFACTURING THE SAME

(71) Applicants: Zhiming Chen, Xiuwen County (CN); Wei Gu, Suzhou (CN); SUZHOU WEIYUAN NEW MATERIAL TECHNOLOGY CO., LTD., Suzhou (CN)

(72) Inventors: Zhiming Chen, Xiuwen County (CN); Wei Gu, Suzhou (CN)

(73) Assignees: Zhiming Chen, Guizhou (CN); Wei Gu, Jiangsu (CN); SUZHOU WEIYUAN NEW MATERIAL TECHNOLOGY CO., LTD., Jiangsu (CN)

(*) Notice: Subject to any disclaimer, the term of this patent is extended or adjusted under 35 U.S.C. 154(b) by 335 days.

(21) Appl. No.: 14/998,285

(22) Filed: Dec. 24, 2015

(65) Prior Publication Data

US 2016/0131357 A1    May 12, 2016

Related U.S. Application Data

(63) Continuation of application No. PCT/CN2014/078442, filed on May 26, 2014.

(30) Foreign Application Priority Data

Jun. 25, 2013    (CN) .......................... 2013 1 0257295

(51) Int. Cl.
*F21V 29/76*      (2015.01)
*F21V 29/71*      (2015.01)
(Continued)

(52) U.S. Cl.
CPC .............. *F21V 29/76* (2015.01); *F21S 8/086* (2013.01); *F21V 29/51* (2015.01); *F21V 29/54* (2015.01);
(Continued)

(58) Field of Classification Search
CPC ........... F21S 8/086; F21V 29/71; F21V 29/54
See application file for complete search history.

(56) References Cited

U.S. PATENT DOCUMENTS 5,209,786 A    5/1993    Rolfe et al. .................... 136/211
8,546,835 B2 *   10/2013    Park ..................... H01L 33/645
                                                                     257/99
(Continued)

FOREIGN PATENT DOCUMENTS

CN          1612371 A      5/2005
CN       201819471 U      5/2011
(Continued)

OTHER PUBLICATIONS

Chinese International Search Report of corresponding International PCT Application No. PCT/CN2014/078442, dated Jul. 28, 2014.
(Continued)

*Primary Examiner* — Elmito Breval
(74) *Attorney, Agent, or Firm* — J.C. Patents

(57) ABSTRACT

A low light failure high power LED street lamp and a manufacturing method therefor. Color mark is made on tail end of N-type semiconductor element (6) or P-type semiconductor element (7); then N-type and P-type semiconductor element (6, 7) are arranged in matrix manner between upper beryllium-oxide ceramic wafer (8) and lower beryllium-oxide ceramic wafer (9), so that head end of N-type semiconductor element (6) is connected with tail end of P-type semiconductor element (7) or tail end of N-type semiconductor element (6) is connected with head end of
(Continued)

P-type semiconductor element (7), then lower beryllium-oxide ceramic wafer (9) is attached, through graphene thermal conductive greaseon layer (4), on backside of circuit board (2) which is mounted with LED bulbs (3), and heat sink (15) is mounted on upper beryllium-oxide ceramic wafer (8), then circuit board (2) together with heat sink (15) are mounted into street lamp housing (1).

5 Claims, 2 Drawing Sheets

(51) Int. Cl.
    *F21S 8/08*        (2006.01)
    *F21V 29/51*      (2015.01)
    *F21V 29/54*      (2015.01)
    *H01L 35/32*      (2006.01)
    *H01L 35/34*      (2006.01)
    *F21W 131/103*    (2006.01)
    *F21Y 115/10*     (2016.01)

(52) U.S. Cl.
    CPC .............. *F21V 29/71* (2015.01); *H01L 35/32* (2013.01); *H01L 35/34* (2013.01); *F21W 2131/103* (2013.01); *F21Y 2115/10* (2016.08)

(56) References Cited

U.S. PATENT DOCUMENTS

| | | | | |
|---|---|---|---|---|
| 9,103,540 B2* | 8/2015 | Wyrick | .............. | H05B 33/0803 |
| 2009/0046458 A1* | 2/2009 | Lee | ....................... | F21S 48/328 |
| | | | | 362/235 |
| 2009/0153007 A1* | 6/2009 | Jiang | ....................... | H01L 35/30 |
| | | | | 313/11 |
| 2009/0167134 A1* | 7/2009 | Tsao | ........................... | F21K 9/00 |
| | | | | 313/46 |
| 2010/0127299 A1 | 5/2010 | Smith et al. | .................... | 257/99 |

FOREIGN PATENT DOCUMENTS

| | | |
|---|---|---|
| CN | 102297408 A | 12/2011 |
| CN | 102297544 A | 12/2011 |
| CN | 103398358 A | 11/2013 |
| CN | 203336367 U | 12/2013 |
| JP | H02-224184 A | 9/1990 |
| JP | 2000-164945 A | 6/2000 |
| JP | 2000-244027 A | 9/2000 |
| JP | 2002-076451 A | 3/2002 |
| JP | 2004-221409 A | 8/2004 |
| JP | 2004-335499 A | 11/2004 |
| JP | 2007-66696 A | 3/2007 |
| JP | 3158820 U | 3/2010 |
| JP | 3159179 U | 4/2010 |
| WO | WO 2012/040925 A1 | 4/2012 |

OTHER PUBLICATIONS

Chinese First Examination Report of corresponding China patent application No. 201310257295.6, dated Dec. 22, 2014.
Khan M.F. Shahil et al., "Thermal properties of graphene and multilayer graphene: Applications in thermal interface materials" Solid State Communications, vol. 152, (2012), pp. 1331-1340.
The extended European Search Report of corresponding European patent application No. 14816753.9 and corresponding international PCT application No. PCT/CN2014/078442, dated May 30, 2016.
The Japanese Examination Report of corresponding Japnese patent application No. 2016-522204, dated Oct. 7, 2016.

* cited by examiner

LOW LIGHT FAILURE, HIGH POWER LED STREET LAMP AND METHOD FOR MANUFACTURING THE SAME

CROSS-REFERENCE TO RELATED APPLICATIONS

This application is a continuation of International Application No. PCT/CN2014/078442, filed on May 26, 2014, which claims priority to Chinese Patent Application No. 201310257295.6, filed on Jun. 25, 2013, both of which are hereby incorporated by reference in their entireties.

TECHNICAL FIELD

The present invention relates to a low light failure, high power LED street lamp and a method for manufacturing the same, which belongs to the technical field of high power LED street lamps.

BACKGROUND

Currently, light emitting diode (Light Emitting Diode, LED) has been widely applied as the light source for illumination due to the advantages such as energy saving, high brightness and small size. However, in the prior art, the heat dissipation structure of the LED light source generally adopts a cooling fin of aluminum alloy structure or adopts a heavier aluminum pouring piece for heat dissipation. Although these structures seem simple, but there exist disadvantages such as poor heat dissipation effect, high manufacturing cost, unable to effectively cool the LED lamps during operation etc, the performance is poor, thus are not suitable for high power LED lamps with power higher than 150W. Besides, since profile aluminum will generate cascade temperatures while dissipating heat, an LED may operate under the temperature higher than 70° C., which accelerates the aging of the LED, substantial light failure phenomenon will occur and the luminous efficiency significantly reduces, thereby increasing power consumption of the LED, shortening the service life and increasing the costs. Moreover, in order to meet the requirement of heat dissipation of high power LED street lamps, the cooling fin must be manufactured large, thus there also exist problems such as large size and heavy weight etc. Therefore, the structure style of current LED street lamps adopting LED as the light source is undesirable, which cannot sufficiently achieve power saving advantage of the LED light source.

SUMMARY

In order to overcome the defects in the prior art, an object of the present invention is to provide a low light failure, high power LED street lamp and a method for manufacturing the same, which is of simple structure, small size, light weight and has advantages such as high light emitting efficiency, long service life and lower power consumption.

The present invention is achieved as follows: a method for manufacturing a low light failure high power LED street lamp according to the present invention includes: adopting an N-type semiconductor element and a P-type semiconductor element as cooling elements for heat dissipation of the circuit board mounted with an LED bulb, wherein, when adopting the N-type semiconductor element and P-type semiconductor element as the cooling elements, processing a crystal bar for manufacturing the N-type semiconductor element or the P-type semiconductor element in advance to be a cone shaped crystal bar with one end big and the other end small, then cutting the cone shaped crystal bar into slices to obtain wafers with the same thickness, in which the surface with a smaller diameter is regarded as a head end and the surface with a larger diameter is regarded as a tail end, making a color mark on the tail end surface for each wafer; then cutting and granulating the conical surface of each wafer to the same polygonal cylinder shapes, the semiconductor with the polygonal cylinder shape is the N-type or P-type semiconductor element with the head end and the tail end, then arranging the N-type semiconductor element and P-type semiconductor element in a manner of matrix between an upper beryllium-oxide ceramic wafer and a lower beryllium-oxide ceramic wafer, both the upper beryllium-oxide ceramic wafer and the lower beryllium-oxide ceramic wafer are provided with a conductive circuit, so that the N-type semiconductor element and the P-type semiconductor element in each column are connected in series, when connecting in series, the head end of the N-type semiconductor element is connected with the tail end of the P-type semiconductor element or the tail end of the N-type semiconductor element is connected with the head end of the P-type semiconductor element, then attaching the lower beryllium-oxide ceramic wafer, through a graphene thermal conductive greaseon layer, on the backside of the circuit board which is mounted with the LED bulb, and mounting a heat sink on the upper beryllium-oxide ceramic wafer, then mounting the circuit board together with the heat sink into a street lamp housing.

A low light failure, high power LED street lamp constructed according to the above method includes: a street lamp housing, a circuit board mounted with an LED bulb and a direct current power source, wherein, the circuit board is connected with the direct current power source via a conductive wire, and the circuit board and the direct current power source are mounted in the street lamp housing, a transparent cover is provided at the bottom of the street lamp housing, wherein, at least one lower beryllium-oxide ceramic wafer is connected with a backside of the circuit board through a graphene thermal conductive greaseon layer, an upper beryllium-oxide ceramic wafer is provided on the lower beryllium-oxide ceramic wafer, an N-type semiconductor element and a P-type semiconductor element are connected between the upper beryllium-oxide ceramic wafer and the lower beryllium-oxide ceramic wafer in a manner of rectangular shape, an end of both the N-type semiconductor and the P-type semiconductor is provided with a conductive color mark, the end with the color mark is regarded as the tail end of the N-type semiconductor element or the P-type semiconductor element, the end without the color mark is regarded as the head end of the N-type semiconductor element or the P-type semiconductor element, each column of N-type semiconductor element and each column of P-type semiconductor element are connected in series respectively through an upper conductive plate provided on the upper beryllium-oxide ceramic wafer and through a lower conductive plate provided on the lower beryllium-oxide ceramic wafer, and the head end of each column of N-type semiconductor element is connected with the tail end of each column of P-type semiconductor element or the tail end of each column of N-type semiconductor element is connected with the head end of each column of P-type semiconductor element, each column of N-type semiconductor element and each column of P-type semiconductor element are connected with the direct current power source through a conductive wire on the upper conductive plate or the lower conductive plate provided at two outmost ends of the column; a beryllium copper plate pressing block is attached on the upper surface of each upper beryllium-oxide ceramic wafer, a heat sink is mounted on the beryllium copper plate pressing block.

The heat sink consists of a heat dissipating aluminum base, a thermal conductive pipe and a cooling fin, the heat dissipating aluminum base is pressed on the beryllium copper plate pressing block, a lower portion of the thermal conductive pipe is made to be a flat shape and is embedded into a hole at the bottom of the heat dissipating aluminum base, and the flat shaped surface of the lower portion of the thermal conductive pipe is attached on the beryllium copper plate pressing block, the cooling fin is connected with an upper portion of the thermal conductive pipe, and is arranged above the heat dissipating aluminum base, the heat dissipating aluminum base is fixed on the circuit board with screws.

The thermal conductive pipe of the heat sink is filled with thermal conductive liquid.

A heat dissipation hole is provided on sides of the street lamp housing.

Due to the adoption of the above technical solutions, based on the conventional manufacturing of N-type semiconductor element and P-type semiconductor element, the semiconductor crystal bar is made with a color mark after being cut, so that the head end and tail end of the N-type semiconductor element or the P-type semiconductor element can be distinguished in a convenient way, and the arranging orientation of the head end or tail end is in consistent with that of the crystal bar before being cut. As such, when forming semiconductor cold dome couple element adopting the N-type semiconductor element and P-type semiconductor element, it is easy to distinguish the tail end and the head end, thereby avoiding the situation in the prior art that the tail and head ends are connected disorderly due to the indistinguishable head and tail ends, when connecting the N-type semiconductor element and P-type semiconductor element, and the operating efficiency of the semiconductor cold dome couple element formed is reduced. When manufacturing cold elements adopting the N-type semiconductor element and P-type semiconductor element of the present invention, it is convenient to achieve an ordered connection of the head end and the tail end, which will increase operating efficiency of each N-type semiconductor element and P-type semiconductor element, and effectively increase refrigerating effect of the whole refrigerating and cooling device. When the semiconductor cold dome couple element formed adopting the N-type semiconductor element and P-type semiconductor element of the present invention is in operation, the temperature difference between the cold end and the hot end ranges between 73-78° C., the refrigerating effect is significantly superior to those in the prior art. Additionally, in the present invention, through directly cooling and refrigerating the circuit board of the LED light source adopting the N-type semiconductor element and P-type semiconductor element or performing thermal neutralization, the operating temperature of the circuit board of the LED light source can be significantly reduced. In the present invention, during operation, it is only needed to put mains supply on the direct current power source for normal operation, at this time, the LED bulb on the circuit board of the LED light will operate normally, and the semiconductor cold dome couple element formed by the N-type semiconductor element and P-type semiconductor element will begin to refrigerate, during operation, the cold end of the semiconductor cold dome couple element will cool and refrigerate the circuit board of the LED light source, and the heat generated by the hot end of the semiconductor cold dome couple element is transmitted to the cooling fin through the thermal conductive pipe of the heat sink, the cooling fin dissipates the heat into the air. After testing, when the power of the circuit of the LED light source is 200W, under the situation of cooling and heat dissipating using the method of the present invention, after continuous operation of 9000 hours, the temperature of the LED on the circuit board of the LED light source will not exceed 60° C., light failure phenomenon of the LED does not occur. The weight of the low light failure LED street lamp of 200W is less than 5 kg, which is ⅓ of the conventional LED street lamp of the same power, the size thereof is ½ of the conventional LED street lamp of the same power. Therefore, comparing with the prior art, the present invention has advantages, such as good heat dissipation effect, significantly reducing operating temperature of the LED light source, no light failure, long service life, good operating stability and increasing operating efficiency of the LED bulb etc.

REFERENCE SIGNS

1—Street lamp housing, 1.1—Heat dissipation hole, 2—Circuit board, 3—LED bulb, 4—Graphene thermal conductive grease layer, 5—Transparent cover, 6—N-type semiconductor element, 7—P-type semiconductor element, 8—Upper beryllium-oxide ceramic wafer, 9—Lower beryllium-oxide ceramic wafer, 10—Upper conductive plate, 11—Lower conductive plate, 12—Conductive wire, 13—Direct current power source, 14—Beryllium copper plate pressing block, 15—Heat sink, 15.1—Heat dissipating aluminum base, 15.2—Thermal conductive pipe, 15.3—Cooling fin, 15.4—Thermal conductive liquid, 16—Screw.

DESCRIPTION OF EMBODIMENTS

The present invention is described below in further detail with reference to accompanying drawings and embodiments.

Embodiment of the present invention: a method for manufacturing a low light failure high power LED street lamp includes: adopting N-type semiconductor element and P-type semiconductor element as cooling elements for heat dissipation of the circuit board mounted with the LED bulb, when adopting the N-type semiconductor element and P-type semiconductor element as the cooling elements, the crystal bar for manufacturing the N-type semiconductor element or the P-type semiconductor element is processed in advance to be a cone shaped crystal bar with one end big and the other end small (diameter of the small end of the crystal bar can be determined according to actual needs, its taper degree can be controlled within the range of 2-5 degrees), then the cone shaped crystal bar is cut into slices to obtain wafers with the same thickness, in which the surface with a smaller diameter is regarded as the head end and the surface with a larger diameter is regarded as the tail end, a color mark is made on the tail end surface for each wafer; then the conical surface of each wafer is cut and granulated to the same polygonal cylinder shapes, the semiconductor with the polygonal cylinder shape is the N-type or P-type semiconductor element with head end and tail end, then the N-type semiconductor element and P-type semiconductor element are arranged in a manner of matrix between an upper beryllium-oxide ceramic wafer and a lower beryllium-oxide ceramic wafer, both of which are provided with conductive circuit, so that the N-type semiconductor element and the P-type semiconductor element in each column are connected in series, when connecting in series, the head end of the N-type semiconductor element is connected with the tail end of the P-type semiconductor element or the tail end of the N-type semiconductor element is connected with the head end of the P-type semiconductor element, then the lower beryllium-oxide ceramic wafer is attached, through a graphene thermal conductive greaseon layer, on the backside of the circuit board which is mounted with LED bulbs, and a heat sink is mounted on the upper beryllium-oxide ceramic wafer, then the circuit board is mounted together with the heat sink into the street lamp housing.

Figure 1:
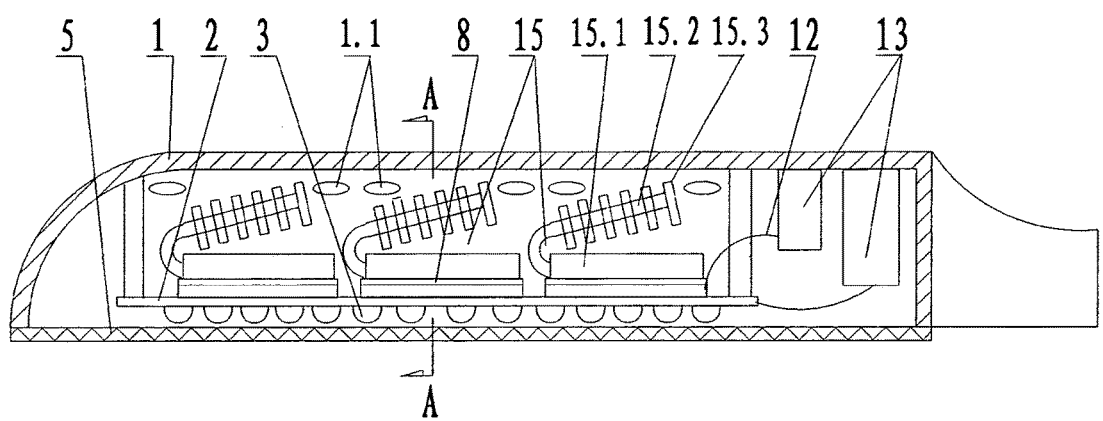
FIG. 1 is a schematic structural diagram of the present invention.
Figure 2:
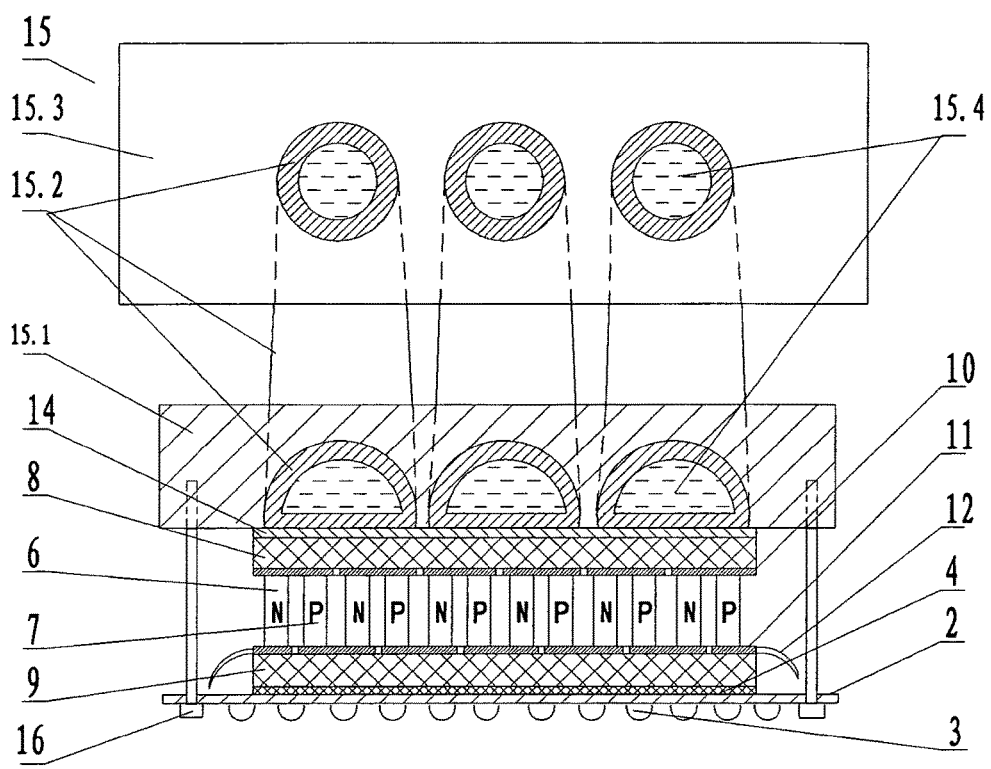
FIG. 2 is a schematic sectional view taken along the line A-A of FIG. 1 after removing a housing and a transparent cover for a street lamp.

The structure of a low light failure, high power LED street lamp constructed according to the above method is as shown in FIG. 1 and FIG. 2, the low light failure, high power LED street lamp includes a street lamp housing 1, a circuit board 2 mounted with LED bulbs 3 and a direct current power source 13, all of which can adopt products in the prior art. The street lamp housing can adopt street lamp housing product made of plastic or metal material and is provided with a tail seat connecting with an electrical pole holder. The circuit board 2 is connected with the direct current power source 13 via a conductive wire, and the circuit board 2 and the direct current power source 13 are mounted in the street lamp housing 1. At least one lower beryllium-oxide ceramic wafer 9 (the number of the lower beryllium-oxide ceramic wafer 9 connected with the backside of the circuit board 2 can be determined according to the area of the circuit board 2 used, during producing, the backside of the circuit board 2 is preferably fully attached with lower beryllium-oxide ceramic wafers 9) is connected with the backside of the circuit board 2 through a graphene thermal conductive greaseon layer 4. Then the upper beryllium-oxide ceramic wafer 8 is provided on the lower beryllium-oxide ceramic wafer 9, meanwhile the N-type semiconductor element 6 and P-type semiconductor element 7 arranged in a manner of a conventional rectangular shape are connected between the upper beryllium-oxide ceramic wafer 8 and the lower beryllium-oxide ceramic wafer 9. When mounting, an end of both the N-type semiconductor and the P-type semiconductor is provided with a conductive color mark, the end with the color mark is regarded as the tail end of the N-type semiconductor element 6 or the P-type semiconductor element 7, the end without the color mark is regarded as the head end of the N-type semiconductor element 6 or the P-type semiconductor element 7. Then each column of N-type semiconductor element 6 and each column of P-type semiconductor element 7 are connected in series respectively through an upper conductive plate 10 provided on the upper beryllium-oxide ceramic wafer 8 and through a lower conductive plate 11 provided on the lower beryllium-oxide ceramic wafer 9, so that the head end of each column of N-type semiconductor element 6 is connected with the tail end of each column of P-type semiconductor element 7, each column of N-type semiconductor element 6 and each column of P-type semiconductor element 7 are connected with the direct current power source 13 through a conductive wire 12 on the upper conductive plate 10 or the lower conductive plate 11 provided at two outmost ends of the column. A beryllium copper plate pressing block 14 with high mechanical strength and conductivity is attached on the upper surface of each upper beryllium-oxide ceramic wafer 8, a heat sink 15 is mounted on the beryllium copper plate pressing block 14. The heat sink 15 consists of a heat dissipating aluminum base 15.1, a thermal conductive pipe 15.2 and a cooling fin 15.3 (as shown in FIG. 1 and FIG. 2). The heat dissipating aluminum base 15.1 is pressed on the beryllium copper plate pressing block 14, the lower portion of the thermal conductive pipe 15.2 is made to be a flat shape and is embedded into a hole at the bottom of the heat dissipating aluminum base 15.1, meanwhile the flat shaped surface of the lower portion of the thermal conductive pipe 15.2 is attached on the beryllium copper plate pressing block 14, then the cooling fin 15.3 is connected with the upper portion of the thermal conductive pipe 15.2, and the cooling fin 15.3 is arranged above the heat dissipating aluminum base 15.1, then the heat dissipating aluminum base 15.1 is fixed on the circuit board 2 with screws 16 (when connecting, it should be noted that the screw 16 and the circuit board 2 are insulated from each other). In order to achieve better heat transmission and heat dissipation, thermal conductive liquid 15.4 can be filled in the thermal conductive pipe 15.2, when filling the thermal conductive liquid 15.4, it should be noted that the space in the thermal conductive pipe 15.2 should not be fully filled, there should remain certain space so that the thermal conductive liquid 15.4 flows therein. The thermal conductive liquid 15.4 can be normal water, distilled water or transformer oil. In order to achieve better heat dissipation, a heat dissipation hole 1.1 can be provided on both symmetrical sides of the street lamp housing 1. At last, a transparent cover 5 is mounted on the bottom of the street lamp housing 1. The transparent cover 5 can be made of glass or organic glass in a conventional manner.

What is claimed is:

1. A method for manufacturing a low light failure, high power LED street lamp, comprising: adopting an N-type semiconductor element and a P-type semiconductor element as cooling elements for heat dissipation of a circuit board mounted with an LED bulb, wherein, when adopting the N-type semiconductor element and P-type semiconductor element as the cooling elements, processing a crystal bar for manufacturing the N-type semiconductor element or the P-type semiconductor element in advance to be a cone shaped crystal bar with one end bigger and the other end smaller, then cutting the cone shaped crystal bar into slices to obtain wafers with the same thickness, in which the surface with a smaller diameter is regarded as a head end and the surface with a larger diameter is regarded as a tail end, making a color mark on the tail end surface for each wafer; then cutting and granulating the conical surface of each wafer to the same polygonal cylinder shapes, wherein the semiconductor with the polygonal cylinder shape is the N-type or P-type semiconductor element with the head end and the tail end, then arranging the N-type semiconductor element and P-type semiconductor element in a manner of matrix between an upper beryllium-oxide ceramic wafer and a lower beryllium-oxide ceramic wafer, both the upper beryllium-oxide ceramic wafer and the lower beryllium-oxide ceramic wafer are provided with a conductive circuit, so that the N-type semiconductor element and the P-type semiconductor element in each column are connected in series, when connecting in series, the head end of the N-type semiconductor element is connected with the tail end of the P-type semiconductor element or the tail end of the N-type semiconductor element is connected with the head end of the P-type semiconductor element, then attaching the lower beryllium-oxide ceramic wafer, through a graphene thermal conductive greaseon layer, on the backside of the circuit board which is mounted with the LED bulb, and mounting a heat sink on the upper beryllium-oxide ceramic wafer, then mounting the circuit board together with the heat sink into a street lamp housing.

2. A low light failure, high power LED street lamp, comprising a street lamp housing (1), a circuit board (2) mounted with an LED bulb (3) and a direct current power source (13), wherein, the circuit board (2) is connected with the direct current power source (13) via a conductive wire, and the circuit board (2) and the direct current power source (13) are mounted in the street lamp housing (1), a transparent cover (5) is provided at the bottom of the street lamp housing (1), wherein, at least one lower beryllium-oxide ceramic wafer (9) is connected with a backside of the circuit board (2) through a graphene thermal conductive greaseon layer (4), an upper beryllium-oxide ceramic wafer (8) is provided on the lower beryllium-oxide ceramic wafer (9), an N-type semiconductor element (6) and a P-type semiconductor element (7) are connected between the upper beryllium-oxide ceramic wafer (8) and the lower beryllium-oxide ceramic wafer (9) in a manner of rectangular shape, an end of both the N-type semiconductor and the P-type semiconductor is provided with a conductive color mark, the end with the color mark is regarded as the tail end of the N-type semiconductor element (6) or the P-type semiconductor element (7), the end without the color mark is regarded as the head end of the N-type semiconductor element (6) or the P-type semiconductor element (7), each column of N-type semiconductor element (6) and each column of P-type semiconductor element (7) are connected in series respectively through an upper conductive plate (10) provided on the upper beryllium-oxide ceramic wafer (8) and through a lower conductive plate (11) provided on the lower beryllium-oxide ceramic wafer (9), and the head end of each column of N-type semiconductor element (6) is connected with the tail end of each column of P-type semiconductor element (7) or the tail end of each column of N-type semiconductor element (6) is connected with the head end of each column of P-type semiconductor element (7), each column of N-type semiconductor element (6) and each column of P-type semiconductor element (7) are connected with the direct current power source (13) through a conductive wire (12) on the upper conductive plate (10) or the lower conductive plate (11) provided at two outmost ends of the column; a beryllium copper plate pressing block (14) is attached on the upper surface of each upper beryllium-oxide ceramic wafer (8), a heat sink (15) is mounted on the beryllium copper plate pressing block (14).

3. The low light failure high power LED street lamp according to claim 2, wherein, the heat sink (15) consists of a heat dissipating aluminum base (15.1), a thermal conductive pipe (15.2) and a cooling fin (15.3), the heat dissipating aluminum base (15.1) is pressed on the beryllium copper plate pressing block (14), a lower portion of the thermal conductive pipe (15.2) is made to be a flat shape and is embedded into a hole at the bottom of the heat dissipating aluminum base (15.1), and the flat shaped surface of the lower portion of the thermal conductive pipe (15.2) is attached on the beryllium copper plate pressing block (14), the cooling fin (15.3) is connected with an upper portion of the thermal conductive pipe (15.2), and is arranged above the heat dissipating aluminum base (15.1), the heat dissipating aluminum base (15.1) is fixed on the circuit board (2) with screws (16).

4. The low light failure high power LED street lamp according to claim 3, wherein, the thermal conductive pipe (15.2) of the heat sink (15) is filled with thermal conductive liquid (15.4).

5. The low light failure high power LED street lamp according to claim 2, wherein, a heat dissipation hole (1.1) is provided on sides of the street lamp housing (1).

* * * * *